(12) United States Patent
Kato et al.

(10) Patent No.: US 8,268,706 B2
(45) Date of Patent: Sep. 18, 2012

(54) SEMICONDUCTOR DEVICE MANUFACTURING METHOD

(75) Inventors: Ryou Kato, Osaka (JP); Masaki Fujikane, Osaka (JP); Akira Inoue, Osaka (JP); Atsushi Yamada, Osaka (JP); Toshiya Yokogawa, Nara (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/061,544

(22) PCT Filed: Jul. 29, 2009

(86) PCT No.: PCT/JP2009/003586
§ 371 (c)(1),
(2), (4) Date: Mar. 1, 2011

(87) PCT Pub. No.: WO2010/116424
PCT Pub. Date: Oct. 14, 2010

(65) Prior Publication Data
US 2011/0159667 A1    Jun. 30, 2011

(30) Foreign Application Priority Data
Apr. 8, 2009  (JP) .................................. 2009-094209

(51) Int. Cl.
*H01L 21/203* (2006.01)
(52) U.S. Cl. ................. 438/478; 438/507; 257/E21.091
(58) Field of Classification Search .................. 438/478, 438/507
See application file for complete search history.

(56) References Cited

U.S. PATENT DOCUMENTS

| | | |
|---|---|---|
| 5,306,662 A | 4/1994 | Nakamura et al. |
| 5,468,678 A | 11/1995 | Nakamura et al. |
| 5,902,393 A | 5/1999 | Nido et al. |
| 5,932,896 A | 8/1999 | Sugiura et al. |
| 6,204,084 B1 | 3/2001 | Sugiura et al. |
| 2001/0035532 A1 | 11/2001 | Ito et al. |
| 2006/0183260 A1 | 8/2006 | Kamei et al. |
| 2010/0244087 A1 | 9/2010 | Horie et al. |

FOREIGN PATENT DOCUMENTS

| | | |
|---|---|---|
| JP | 9-199758 | 7/1997 |
| JP | 2000-212356 A | 8/2000 |
| JP | 2001-077414 A | 3/2001 |

(Continued)

OTHER PUBLICATIONS

Form PCT/IPEA/408 (Opinion of the Examiner) and partial English translation thereof; related International Application No. PCT/JP2010/007086, dated Apr. 26, 2011.

(Continued)

*Primary Examiner* — Alexander Ghyka
(74) *Attorney, Agent, or Firm* — Renner, Otto, Boisselle & Sklar, LLP

(57) ABSTRACT

A method for fabricating a semiconductor device according to the present invention includes the steps of: growing a p-type gallium nitride-based compound semiconductor layer by performing a metalorganic chemical vapor deposition process in a heated atmosphere so that the crystal-growing plane of the semiconductor layer is an m plane (Step S13); and cooling the p-type gallium nitride-based compound semiconductor layer (Step S14) after the step of growing has been carried out. The step of growing includes supplying hydrogen gas to a reaction chamber in which the p-type gallium nitride-based compound semiconductor layer is grown. The step of cooling includes cooling the p-type gallium nitride-based compound semiconductor layer with the supply of the hydrogen gas to the reaction chamber cut off.

11 Claims, 9 Drawing Sheets

(a)

FOREIGN PATENT DOCUMENTS

| | | |
|---|---|---|
| JP | 2001-119065 | 4/2001 |
| JP | 3180710 B | 4/2001 |
| JP | 2005-101623 A | 4/2005 |
| JP | 2006-186257 A | 7/2006 |
| JP | 2007-096171 | 4/2007 |
| JP | 2007-173316 A | 7/2007 |
| JP | 4103309 B | 4/2008 |
| JP | 2008-117921 A | 5/2008 |
| WO | 2009/066466 | 5/2009 |

OTHER PUBLICATIONS

International Search Report for corresponding International Application No. PCT/JP2009/003586 mailed Sep. 29, 2009.

Form PCT/ISA/237 for International Application No. PCT/JP2009/003586 dated Sep. 29, 2009 and partial English translation.

Notice of Reasons for Rejection mailed Nov. 2, 2010 and full English translation for corresponding Japanese Application No. 2010-502589 (which is a national phase of International Application No. PCT/JP2009/003586).

○ N
◯ Ga (a)

(b)

(c)

|  | THERMAL CLEANING (AT 850 °C) | n-GaN LAYER 102 (AT 1100 °C) | COOLING (FROM 1100 °C TO LESS THAN 800 °C) | GaN BARRIER LAYERS 103 (AT LESS THAN 800 °C) | InGaN WELL LAYERS 104 (AT LESS THAN 800 °C) | p-GaN LAYER 106 (AT 1000 °C) | COOLING (FROM 1000 °C TO 900 °C) | COOLING (FROM 900 °C TO 400 °C) |
|---|---|---|---|---|---|---|---|---|
| $H_2$ | O | O |  |  |  | O |  |  |
| $N_2$ | O | O | O | O | O | O | O |  |
| $NH_3$ | O | O | O | O | O | O | O | O |
| TMG / TEG |  | O |  | O | O | O |  |  |
| TMI |  |  |  |  | O |  |  |  |
| $Cp_2 Mg$ |  |  |  |  |  | O |  |  |
| $SiH_4$ |  | O |  |  |  |  |  |  |

(a)

(b)

(a)

(b)

SEMICONDUCTOR DEVICE MANUFACTURING METHOD

TECHNICAL FIELD

The present invention relates to a method for fabricating a semiconductor device with a p-type gallium nitride-based compound semiconductor layer.

BACKGROUND ART

A nitride semiconductor including nitrogen (N) as a Group V element is a prime candidate for a material to make a short-wave light-emitting device because its bandgap is sufficiently wide. Among other things, gallium nitride-based compound semiconductors (which will be referred to herein as "GaN-based semiconductors" and which are represented by the formula $Al_xGa_yIn_zN$ (where $0 \leq x, y, z \leq 1$ and $x+y+z=1$)) have been researched and developed particularly extensively. As a result, blue-ray-emitting light-emitting diodes (LEDs), green-ray-emitting LEDs and semiconductor laser diodes made of GaN-based semiconductors have already been used in actual products.

A GaN-based semiconductor has a wurtzite crystal structure. FIG. 1 schematically illustrates a unit cell of GaN. In an $Al_xGa_yIn_zN$ (where $0 \leq x, y, z \leq 1$ and $x+y+z=1$) semiconductor crystal, some of the Ga atoms shown in FIG. 1 may be replaced with Al and/or In atoms.

FIG. 2 shows four fundamental vectors $a_1$, $a_2$, $a_3$ and c, which are generally used to represent planes of a wurtzite crystal structure with four indices (i.e., hexagonal indices). The fundamental vector c runs in the [0001] direction, which is called a "c axis". A plane that intersects with the c axis at right angles is called either a "c plane" or a "(0001) plane". It should be noted that the "c axis" and the "c plane" are sometimes referred to as "C axis" and "C plane". In fabricating a semiconductor device using GaN-based semiconductors, a c-plane substrate, i.e., a substrate of which the principal surface is a (0001) plane, is used as a substrate on which GaN semiconductor crystals will be grown. FIG. 3(a) schematically illustrates the crystal structure of a nitride-based semiconductor, of which the principal surface is a c plane, as viewed on a cross section that intersects with the principal surface of the substrate at right angles. In a c plane, however, there is a slight shift in the c-axis direction between a Ga atom layer and a nitrogen atom layer, thus producing electrical polarization there. That is why the c plane is also called a "polar plane". As a result of the electrical polarization, a piezoelectric field is generated in the InGaN quantum well of the active layer in the c-axis direction. Once such a piezoelectric field has been generated in the active layer, some positional deviation occurs in the distributions of electrons and holes in the active layer due to the quantum confinement Stark effect of carriers. Consequently, the internal quantum efficiency decreases, thus increasing the threshold current in a semiconductor laser diode and increasing the power dissipation and decreasing the luminous efficacy in an LED. Meanwhile, as the density of injected carriers increases, the piezoelectric field is screened, thus varying the emission wavelength, too.

Thus, to overcome these problems, it has been proposed that a substrate, of which the principal surface is a non-polar plane such as a (10–10) plane that is perpendicular to the [10–10] direction and that is called an "m plane", be used. As shown in FIG. 2, the m plane is parallel to the c axis (i.e., the fundamental vector c) and intersects with the c plane at right angles. FIG. 3(b) schematically illustrates the crystal structure of a nitride-based semiconductor, of which the principal surface is an m plane, as viewed on a cross section that intersects with the principal surface of the substrate at right angles. On the m plane, Ga atoms and nitrogen atoms are on the same atomic plane. For that reason, no electrical polarization will be produced perpendicularly to the m plane. That is why if a semiconductor multilayer structure is formed perpendicularly to the m plane, no piezoelectric field will be generated in the active layer, thus overcoming the problems described above. In this case, the "m plane" is a generic term that collectively refers to a family of planes including (10–10), (–1010), (1–100), (–1100), (01–10) and (0–110) planes.

Also, as used herein, the "X-plane growth" means epitaxial growth that is produced perpendicularly to the X plane (where X=c or m) of a hexagonal wurtzite structure. As for the X-plane growth, the X plane will be sometimes referred to herein as a "growing plane". Furthermore, a layer of semiconductor crystals that have been formed as a result of the X-plane growth will be sometimes referred to herein as an "X-plane semiconductor layer".

CITATION LIST

Patent Literature

Patent Document No. 1: Japanese Patent Publication No. 3180710

Patent Document No. 2: Japanese Patent Publication No. 4103309

SUMMARY OF INVENTION

Technical Problem

A p-type gallium nitride-based compound semiconductor layer is grown by carrying out a metalorganic chemical vapor deposition (MOCVD) process with source gases and a p-type dopant supplied into a reaction chamber. In the growing process, ammonia ($NH_3$) gas is usually supplied as a Group V source gas and magnesium (Mg) that can provide holes as positive carriers is normally supplied as a p-type dopant. During that growing process, however, hydrogen atoms that have desorbed from the ammonia gas may combine with magnesium atoms and then enter the crystal and inactivate the magnesium introduced. As a result, the magnesium added cannot work as a p-type dopant anymore. And once magnesium has been inactivated in this manner, the p-type gallium nitride-based compound semiconductor layer will come to have increased resistivity.

Thus, as disclosed in Patent Document No. 1, to break the bond between the magnesium atoms and the hydrogen atoms inside the crystal and detach the hydrogen atoms from the crystal, annealing sometimes needs to be performed as an additional process after the crystal growing process is over. However, by adding such an annealing process, the number of manufacturing process steps and the complexity and cost of the manufacturing process will all increase.

In order to overcome such a problem, Patent Document No. 2 discloses a technique for achieving a similar effect to what is accomplished by the annealing process by modifying the cooling process after the crystal growing process has ended. According to such a method, there is no need to carry out the annealing process, thus significantly reducing the complexity of the device fabrication, but magnesium is activated less effectively as in a situation where the annealing process is performed. Consequently, even if such a method is adopted, the resistivity achieved cannot be lower than the one achieved by performing the annealing process.

On top of that, according to those Patent Documents Nos. 1 and 2, the p-type gallium nitride-based compound semiconductor layer is supposed to grow on a principal surface that is a c plane. However, such inactivation of magnesium is also observed even if the semiconductor layer is grown on an m plane.

It is therefore an object of the present invention to provide a semiconductor device with good enough electrical characteristics by taking a means for preventing a p-type dopant from being inactivated in a p-type gallium nitride-based compound semiconductor layer, which is growing on an m plane, without performing any annealing process.

Solution to Problem

A method for fabricating a semiconductor device according to the present invention includes the steps of: (a) growing a p-type gallium nitride-based compound semiconductor layer by performing a metalorganic chemical vapor deposition process in a heated atmosphere so that the crystal-growing plane of the semiconductor layer is an m plane; and (b) cooling the p-type gallium nitride-based compound semiconductor layer after the step (a) has been carried out. The step (a) includes supplying hydrogen gas to a reaction chamber in which the p-type gallium nitride-based compound semiconductor layer is grown. And the step (b) includes cooling the p-type gallium nitride-based compound semiconductor layer with the supply of the hydrogen gas to the reaction chamber cut off.

In one preferred embodiment, magnesium is added as a p-type dopant to the p-type gallium nitride-based compound semiconductor layer, and the step (a) includes growing the p-type gallium nitride-based compound semiconductor layer so that the concentration of magnesium in the p-type gallium nitride-based compound semiconductor layer falls within the range of $4.0\times10^{18}$ cm$^{-3}$ to $1.8\times10^{19}$ cm$^{-3}$.

In this particular preferred embodiment, the step (a) includes growing the p-type gallium nitride-based compound semiconductor layer so that the concentration of magnesium in the p-type gallium nitride-based compound semiconductor layer falls within the range of $6.0\times10^{18}$ cm$^{-3}$ to $9.0\times10^{18}$ cm$^{-3}$.

In another preferred embodiment, the step (b) includes starting to cool the p-type gallium nitride-based compound semiconductor layer as soon as or after the supply of the hydrogen gas is cut off.

In an alternative preferred embodiment, the step (b) includes starting to cool the p-type gallium nitride-based compound semiconductor layer before the supply of the hydrogen gas is cut off.

In this particular preferred embodiment, the step (a) includes heating the p-type gallium nitride-based compound semiconductor layer to a temperature that is higher than 850° C. And the step (b) includes stopping supplying the hydrogen gas after the p-type gallium nitride-based compound semiconductor layer has started to be cooled and before the temperature of the p-type gallium nitride-based compound semiconductor layer reaches 850° C.

In yet another preferred embodiment, the step (a) includes supplying source gases including ammonia gas to the reaction chamber, and the step (b) includes continuously supplying the ammonia gas to the reaction chamber even after the supply of the hydrogen gas has been cut off.

In a specific preferred embodiment, the step (a) includes supplying not only the source gases but also nitrogen gas to the reaction chamber, and the step (b) includes increasing, after the supply of the hydrogen gas has been cut off, the rate of supplying the nitrogen gas by the rate at which the hydrogen gas has been supplied before being shut off.

Advantageous Effects of Invention

According to the present invention, a p-type gallium nitride-based compound semiconductor layer is cooled with the supply of hydrogen gas to a reaction chamber cut off, thereby making the concentration of hydrogen in the reaction chamber during the cooling process lower than in a conventional process. As a result, the hydrogen atoms that have bonded to a p-type dopant while the p-type gallium nitride-based compound semiconductor layer is being formed can detach themselves easily from the p-type dopant during the cooling process. Consequently, the p-type dopant gets activated and the p-type gallium nitride-based compound semiconductor layer comes to have lower resistivity. According to the present invention, low resistivity that is required for a semiconductor device is realized even without performing an annealing process, thus reducing the complexity of the device fabrication process and cutting down the manufacturing cost significantly.

On top of that, since the annealing process can be omitted according to the present invention, surface roughening can be avoided. Such surface roughening never happens in a c-plane-growing p-type gallium nitride-based compound semiconductor layer that has been, and is still, used extensively. That is why it is particularly beneficial to the process of forming a p-type gallium nitride-based compound semiconductor layer, of which the crystal-growing surface is an m plane, to omit the annealing process.

DESCRIPTION OF EMBODIMENTS

First of all, results of measurements and experiments that the present inventors carried out will be described.

Figure 1:
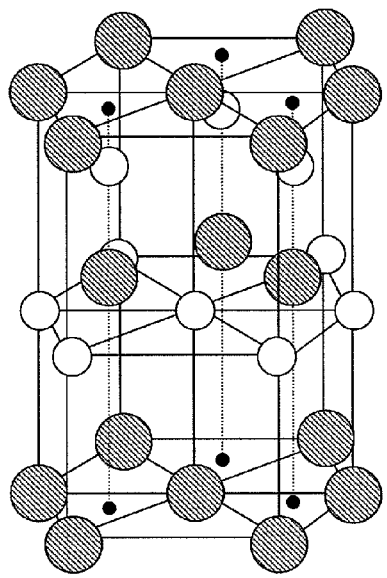
FIG. 1 is a perspective view schematically illustrating a unit cell of GaN.
Figure 2:
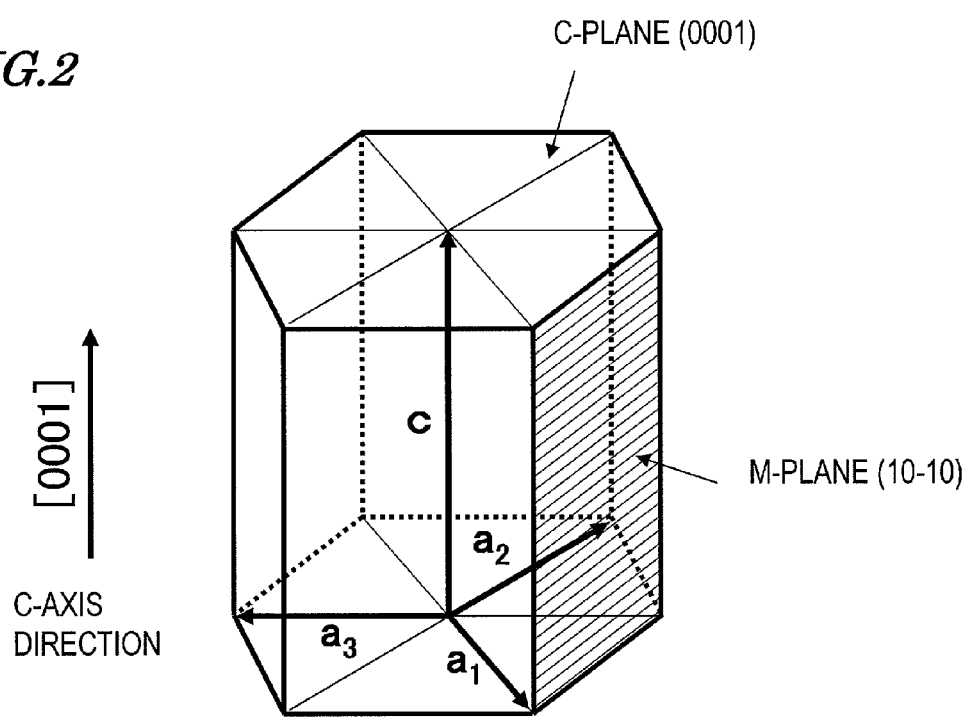
FIG. 2 is a perspective view showing four fundamental vectors $a_1$, $a_2$, $a_3$ and c representing a wurtzite crystal structure.
Figure 3:
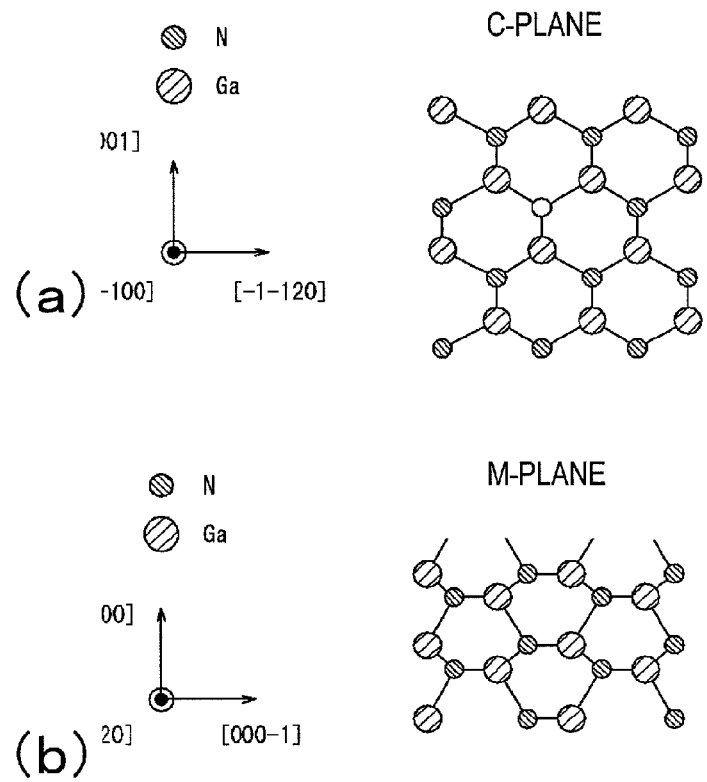
FIG. 3(a) schematically illustrates the crystal structure of a nitride-based semiconductor, of which the principal surface is a c-plane, as viewed on a cross section that intersects with the principal surface of the substrate at right angles.
FIG. 3(b) schematically illustrates the crystal structure of a nitride-based semiconductor, of which the principal surface is an m-plane, as viewed on a cross section that intersects with the principal surface of the substrate at right angles.
Figure 4:
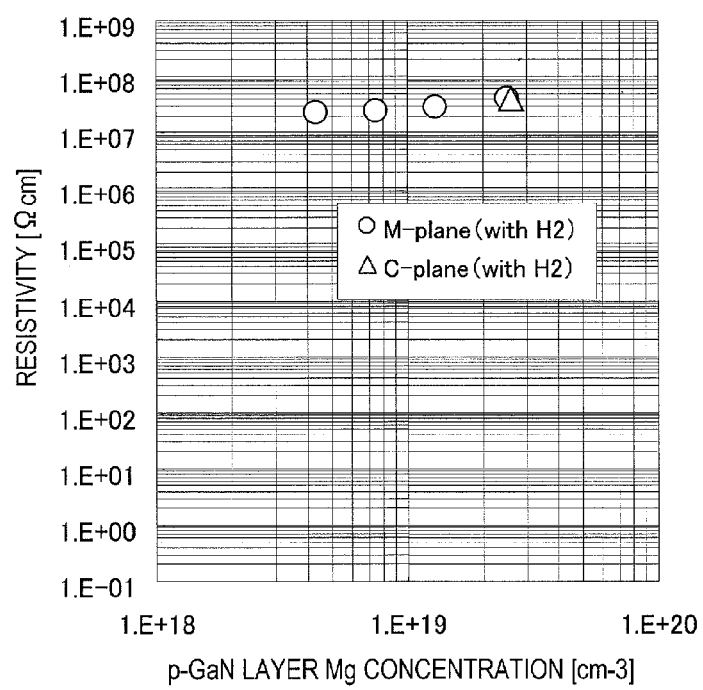
FIG. 4 is a graph showing the resistivity values of c-plane-growing and m-plane-growing p-type gallium nitride-based compound semiconductor layers.

FIG. 4 is a graph showing the resistivity values of a c-plane-growing p-type GaN layer and an m-plane-growing p-type GaN layer. Among these layers, the p-type GaN layer was grown by the same method as a conventional one but had not been subjected to any annealing process. In FIG. 4, the abscissa represents the magnesium concentration and the ordinate represents the resistivity. As for the Mg concentrations of respective samples, the m-plane-growing semiconductor layers had Mg concentrations of $4.3 \times 10^{18}$ cm$^{-3}$, $7.4 \times 10^{18}$ cm$^{-3}$, $1.3 \times 10^{19}$ cm$^{-3}$, and $2.5 \times 10^{19}$ cm$^{-3}$. On the other hand, the c-plane-growing semiconductor layer had an Mg concentration of $2.6 \times 10^{19}$ cm$^{-3}$. As can be seen from FIG. 4, the resistivity values (indicated by the open circles ○) of the m-plane-growing semiconductor layers and that (indicated by the open triangle △) of the c-plane-growing semiconductor layer were both $1 \times 10^7$ Ωcm or more and these semiconductor layers were almost insulators.

Figure 5:
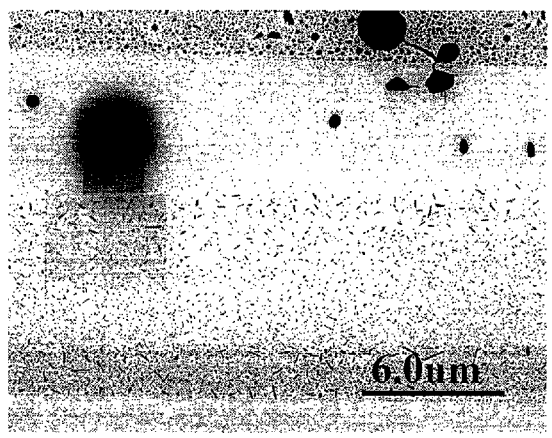
FIGS. 5(a) to 5(c) are SEM photographs that were taken by shooting the surface of the p-type gallium nitride-based compound semiconductor layer that had been formed by m-plane growing.
Figure 5:
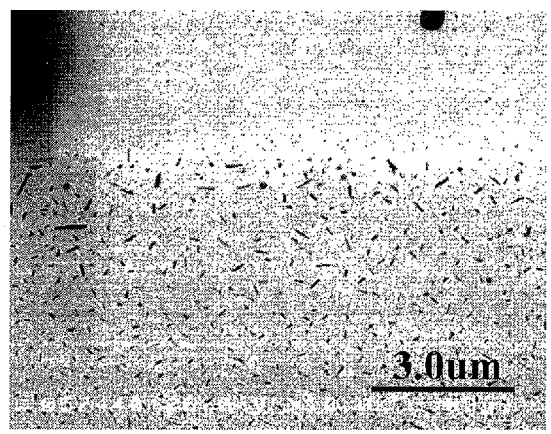
Figure 5:
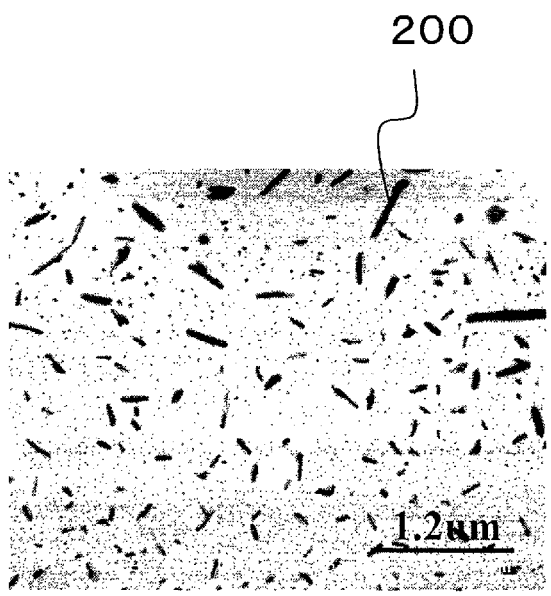

The present inventors further subjected a p-type GaN layer, of which the surface was an m-plane, to a similar annealing process to a conventional one. As a result, the present inventors discovered that even such an m-plane-growing p-type GaN layer also produced fine surface roughening locally. FIGS. 5(a) to 5(c) are SEM photographs that were taken by shooting the surface of the p-type GaN layer that had been formed by m-plane growing. That p-type GaN layer, which was shot to take the photographs shown in FIGS. 5(a) to 5(c), had been annealed at 830° C. for 20 minutes within a nitrogen ambient. Specifically, FIG. 5(b) is a photograph that was taken by shooting some area of the photograph shown in FIG. 5(a) at a higher zoom power than in FIG. 5(a). And FIG. 5(c) is a photograph that was taken by shooting some area of the photograph shown in FIG. 5(b) at a higher zoom power than in FIG. 5(b). As shown in FIG. 5(c), a lot of very small recesses or projections 200 had been made on the surface of the p-type GaN layer, thus roughening the surface of the p-type GaN layer. When such surface roughening as shown in FIGS. 5(a) through 5(c) arises, the density of current injected becomes non-uniform and other inconveniences may be caused. Such surface roughening will also occur even if Ga is partially replaced with Al or In. Meanwhile, the present inventors also observed the surface of a c-plane-growing p-type GaN layer that had been subjected to the annealing process. As a result, no surface roughening as shown in FIGS. 5(a) through 5(d) was observed in the c-plane-growing p-type GaN layer. That is to say, such surface roughening caused by the annealing process is a phenomenon that is peculiar to the m-plane-growing p-type gallium nitride-based compound semiconductor layer.

These results of measurements and considerations reveal that if the annealing process is adopted to reduce the resistivity of the m-plane-growing p-type gallium nitride-based compound semiconductor layer, such a problem peculiar to the m plane will arise. Hereinafter, a specific preferred embodiment of a semiconductor device including such an m-plane-growing p-type gallium nitride-based compound semiconductor layer will be described.

(Embodiment)

Figure 6:
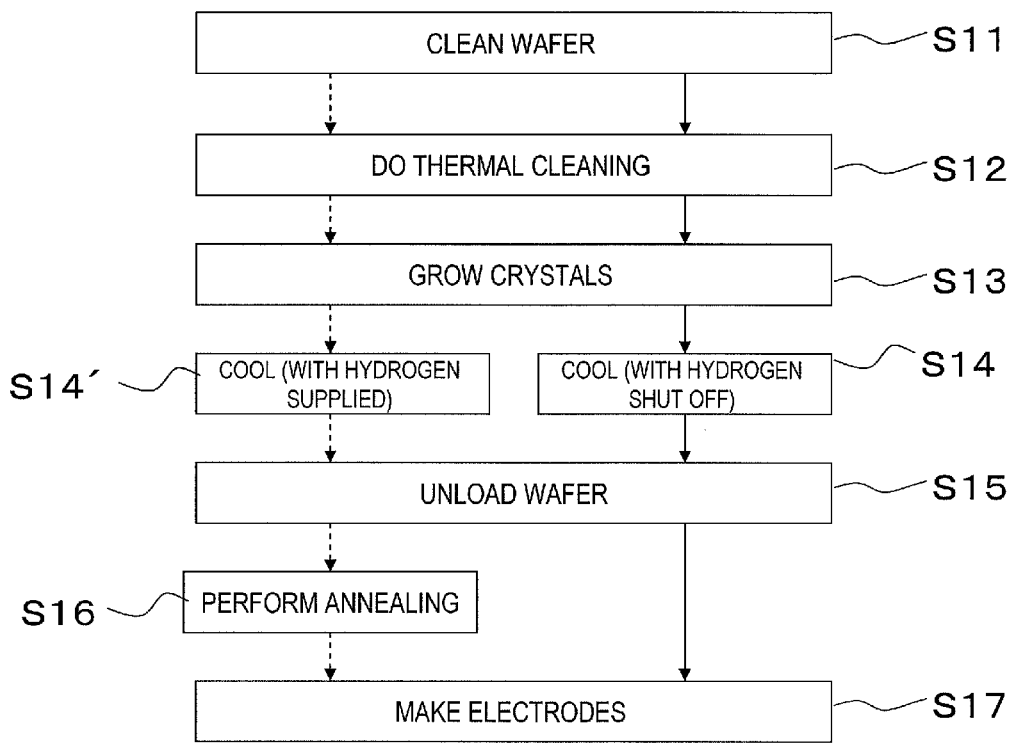
FIG. 6 is a flowchart showing a manufacturing process according to a preferred embodiment of the present invention and a conventional manufacturing process.

A method for fabricating a semiconductor device according to the present invention will now be described with reference to the accompanying drawings. FIG. 6 is a flowchart showing a manufacturing process according to a preferred embodiment of the present invention and a conventional manufacturing process. Specifically, in FIG. 6, the flow of the manufacturing process of this preferred embodiment is indicated by the solid arrows, while the typical flow of the conventional manufacturing process is indicated by the dashed arrows.

As shown in FIG. 6, in the semiconductor device manufacturing process of this preferred embodiment, the wafer is washed in Step S11 and then subjected to thermal cleaning in Step S12. Next, in Step S13, crystals of an m-plane-growing semiconductor layer are grown on the wafer by performing a metalorganic chemical vapor deposition process in a heated atmosphere. In this process, the actual m-planes do not have to be perfectly parallel to the ideal m-plane but could define a very small tilt angle (of zero degrees to ±1 degree) with respect to the ideal m-plane. When a light-emitting element is formed, for example, a semiconductor multilayer structure including an n-type gallium nitride-based compound semiconductor layer, a light-emitting layer, and a p-type gallium nitride-based compound semiconductor layer is formed. In this process step S13, the crystal-growing process is carried out with source gases, carrier gases and a dopant gas, if necessary, supplied into a reaction chamber. Typically, a trimethylgallium (TMG) or triethylgallium (TEG) gas is supplied as a gallium source gas and ammonia is supplied as a nitrogen source gas. Nitrogen ($N_2$) and hydrogen ($H_2$) gases are supplied as carrier gases.

After the p-type gallium nitride-based compound semiconductor layer has grown, the wafer is cooled in Step S14. The conventional cooling process step S14' is carried out with hydrogen supplied continuously since the previous process step S13. On the other hand, the cooling process step of this preferred embodiment is carried out with the supply of the hydrogen gas to the reaction chamber cut off. Specifically, in this cooling process step, the supply of the TMG (or TEG) gas as a gallium source gas is cut off but ammonia continues to be supplied as a nitrogen source gas to prevent nitrogen from detaching itself from the p-type gallium nitride-based compound semiconductor layer. And when this cooling process step is over, the wafer is unloaded from the reaction chamber in Step S15. Next, in Step S17, electrodes and other metallic parts are made. When a light-emitting element is fabricated, for example, p- and n-electrodes are formed on the p- and n-type gallium nitride-based compound semiconductor layers, respectively. In this manner, the semiconductor device of this preferred embodiment is completed.

According to this preferred embodiment, by cooling the wafer with the supply of hydrogen to the reaction chamber cut off, the concentration of hydrogen in the reaction chamber during the cooling process step can be lower than in the conventional process. As a result, the hydrogen atoms that bonded to the p-type dopant when the p-type gallium nitride-based compound semiconductor layer was formed will detach themselves easily from the p-type easily during this cooling process step. Consequently, the p-type dopant gets activated and the resistivity of the p-type gallium nitride-based compound semiconductor layer can be lowered. According to the conventional process, the annealing process step S16 sometimes needs to be done in order to detach hydrogen from the p-type dopant. On the other hand, according to this preferred embodiment, the resistivity can be brought down low enough to operate the semiconductor device properly without performing any annealing process. In this manner, the device can be fabricated with much less trouble and at a significantly reduced manufacturing cost.

In addition, since the annealing process can be omitted according to this preferred embodiment, the surface roughening can be eliminated, too. Such surface roughening never arises in a c-plane-growing p-type gallium nitride-based compound semiconductor layer that has been used extensively in the prior art. That is why by omitting the annealing process, a particularly significant effect will be achieved in the process step of forming a p-type gallium nitride-based compound semiconductor layer, of which the principal surface is an m-plane.

In the conventional manufacturing process, it has been a common practice to use hydrogen as a carrier gas in order to form a gallium nitride-based compound semiconductor layer of quality. That is why even after the p-type gallium nitride-based compound semiconductor layer has grown, the cooling process is usually carried out with hydrogen still supplied continuously. According to this preferred embodiment, however, by stopping the supply of hydrogen to the reaction chamber intentionally during the cooling process, the hydrogen atoms that have bonded to the p-type dopant can be detached easily during the cooling process.

Figure 7:
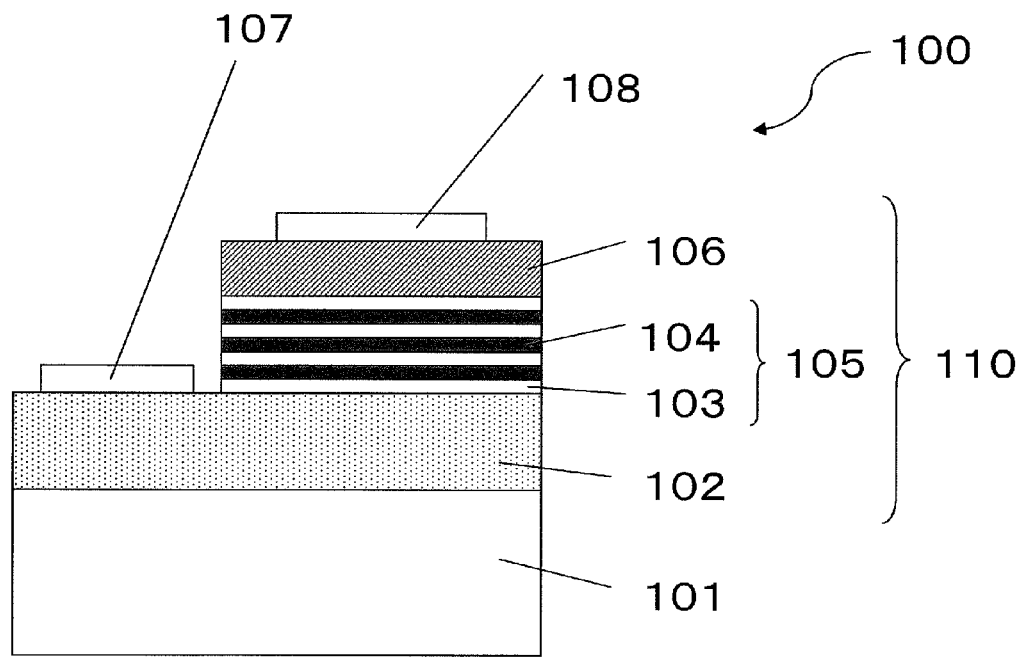
FIG. 7 is a cross-sectional view illustrating an exemplary structure for a semiconductor device 100 that has been fabricated by the manufacturing process of a preferred embodiment of the present invention.

FIG. 7 is a cross-sectional view illustrating an exemplary structure for a semiconductor device 100 that has been fabricated by the manufacturing process of this preferred embodiment. As shown in FIG. 7, this semiconductor device 100 includes a crystal-growing substrate 101, a semiconductor multilayer structure 110 that has been formed on the crystal-growing substrate 101 and that includes an n-GaN layer 102, a GaN/InGaN multi-quantum well light-emitting layer 105, and a p-GaN layer 106, a p-electrode 108 that has been formed on the semiconductor multilayer structure 110, and an n-electrode 107 that has been formed on a portion of the n-GaN layer 102. Specifically, the GaN/InGaN multi-quantum well light-emitting layer 105 has a structure in which at least three pairs of GaN barrier layers 103 and $In_xGa_{1-x}N$ (where 0<x<1) well layers 104 have been stacked alternately one upon the other.

In the semiconductor multilayer structure 110, the GaN/InGaN multi-quantum well light-emitting layer 105 and the p-GaN layer 106 cover only a portion of the n-GaN layer 102 and the n-electrode 107 is arranged on the rest of the n-GaN layer 102 that is not covered with the GaN/InGaN multi-quantum well light-emitting layer 105 or the p-GaN layer 106.

Figure 8:
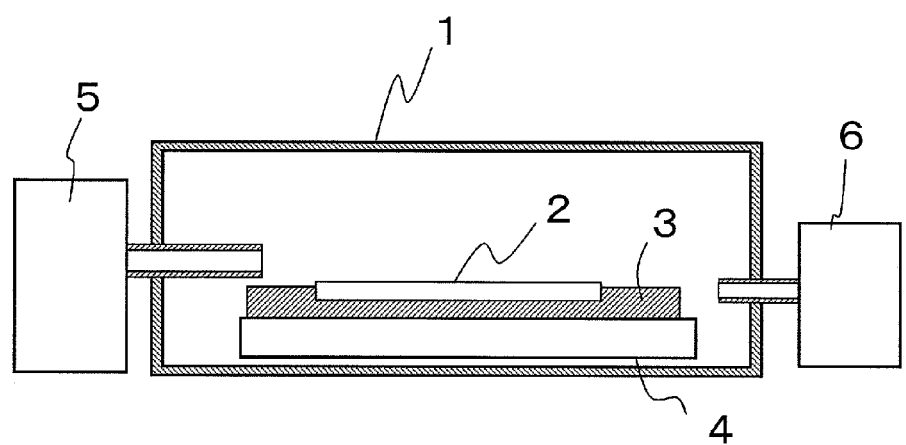
FIG. 8 is a schematic cross-sectional view illustrating an MOCVD (metalorganic chemical vapor deposition) system for use in a preferred embodiment of the present invention.
Figures 9, 10:
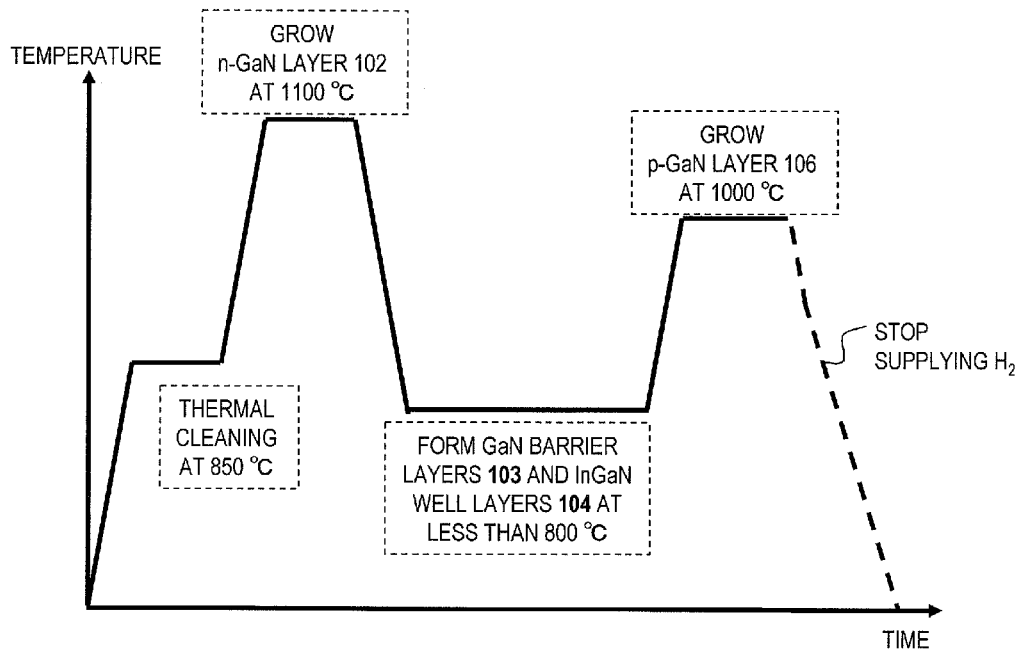
FIG. 9 is a graph showing how the wafer temperature varies in the manufacturing process of a preferred embodiment of the present invention.
FIG. 10 is a table showing various kinds of gases to be supplied into the reaction chamber in respective process steps for fabricating a semiconductor device according to a preferred embodiment of the present invention.

Hereinafter, it will be described in detail with reference to FIGS. 6 to 10 exactly how to fabricate the semiconductor device of this preferred embodiment. FIG. 8 is a schematic cross-sectional view illustrating an MOCVD system for use in this preferred embodiment. FIG. 9 shows how the wafer temperature varies in the manufacturing process of this preferred embodiment. And FIG. 10 shows various kinds of gases to be supplied into the reaction chamber in the respective process steps. In FIG. 10, the gases to be supplied into the reaction chamber in each process step are checked with open circles (○).

In this preferred embodiment, a wafer on which (10-10) m-plane gallium nitride (GaN) can be grown is used as the crystal-growing substrate 101. Such a wafer (or substrate) is most preferably a gallium nitride free-standing substrate, of which the principal surface is an m-plane, but may also be a silicon carbide (SiC) substrate with a 4H or 6H structure and with an m-plane principal surface because the lattice constant of SiC is rather close to that of GaN. Alternatively, a sapphire substrate that also has an m-plane principal surface can be used, too. In any case, if a non-gallium nitride-based compound semiconductor substrate is used as the crystal-growing substrate 101, an appropriate spacer layer or buffer layer is preferably inserted between the crystal-growing substrate 101 and the gallium nitride-based compound semiconductor layers to be formed thereon.

First of all, as in Step S11 shown in FIG. 6, the crystal-growing substrate 101 is washed. Specifically, in this example, the crystal-growing substrate 101 is washed with a buffered hydrofluoric acid (BHF) solution, rinsed with water, and then dried sufficiently. The crystal-growing substrate 101 that has been washed in this manner is transported to the reaction chamber 1 of the MOCVD system shown in FIG. 8 while avoid exposing it to the air as successfully as possible.

As shown in FIG. 8, a quartz tray 3 to support the crystal-growing substrate 2 and a carbon susceptor 4 to mount the quartz tray 3 are arranged in the reaction chamber 1. Although not shown in FIG. 8, a thermocouple is inserted into the carbon susceptor 4 to measure the actual temperature of the carbon susceptor 4, which is heated by a coil (not shown) by RF inductive heating and which functions as a heat source. The crystal-growing substrate 2 will be heated by the heat conduction that has been produced by the carbon susceptor 4. As used herein, the "substrate temperature" is supposed to be the temperature measured by the thermocouple, and is the temperature of the carbon susceptor 4 that functions as a direct heat source with respect to the crystal-growing substrate 2. The temperature measured by the thermocouple should be roughly equal to that of the crystal-growing substrate 2.

The reaction chamber 1 is coupled to not only a gas supplier 5, which supplies various kinds of gases (namely, source gases, carrier gases and dopant gases) into the reaction chamber 1, but also an exhauster 6 (which may be a rotary pump, for example) for exhausting the reaction chamber 1.

Next, as in Step S12 shown in FIG. 6, the crystal-growing substrate 101 is subjected to thermal cleaning. Specifically, while supplying, into the reaction chamber 1, hydrogen and nitrogen ($N_2$) gases as carrier gases at flow rates of 4 to 10 slm and 3 to 8 slm, respectively, and ammonia gas as a Group V source gas at a flow rate of 4 to 10 slm as shown in FIGS. 9 and 10, the substrate is heated to 850° C., thereby do cleaning on the surface of the substrate.

Subsequently, as in Step S13 shown in FIG. 6, a crystal-growing process of the gallium nitride-based compound semiconductor layer is carried out as an MOCVD process in the reaction chamber 1.

Specifically, first of all, with source, n-type dopant and carrier gases supplied into the reaction chamber 1, the substrate is heated to around 1,100° C., thereby growing an n-GaN layer 102 to a thickness of 1 to 4 µm as shown in FIG. 9. In this process step, a TMG or TEG gas is supplied as a Group III source gas at a flow rate of 10 to 40 sccm and ammonia gas is supplied as a Group V source gas at a flow rate of 4 to 10 slm as shown in FIG. 10. Also, a silane gas is supplied to introduce Si as an n-type dopant at a flow rate of 10 to 30 sccm and hydrogen and nitrogen gases are supplied as carrier gases at flow rates of 4 to 10 slm and 3 to 8 slm, respectively.

Thereafter, as shown in FIG. 9, the substrate is cooled to less than 800° C. to form a GaN/InGaN multi-quantum well light-emitting layer 105. In this cooling process step, the supply of the silane and TMG (or TEG) gases is cut off but the ammonia gas is continuously supplied at a flow rate of 15 to 20 slm as shown in FIG. 10. Also, the hydrogen gas, which is one to the two carrier gases that have been supplied, stops being supplied and only the nitrogen gas, which is the other carrier gas, continues to be supplied at a flow rate of 15 to 20 slm. In this process step, once the supply of the hydrogen gas has been cut off, it is not until the GaN barrier layers 103 and the $In_xGa_{1-x}N$ (where 0<x<1) well layers 104 have been stacked that the supply of the hydrogen gas is resumed as shown in FIG. 10. The supply of the hydrogen gas is cut off in this manner in order to feed as much In as possible into the $In_xGa_{1-x}N$ (where 0<x<1) well layers 104 being deposited. However, it not uncommon to stop supplying the hydrogen gas in this process step but it is a common practice in the conventional process, too.

When the temperature of the substrate being cooled becomes less than 800° C. and gets stabilized there, the TMG (or TEG) gas resumes being supplied as a Ga source gas at a flow rate of 4 to 10 sccm, thereby forming a GaN barrier layers 103.

Next, a trimethylindium (TMI) gas starts being supplied with the temperature of the substrate maintained, thereby forming an $In_xGa_{1-x}N$ (where 0<x<1) well layer 104. At this point in time, nitrogen, ammonia, TMG (or TEG) and TMI gases are supplied at flow rates of 15-20 slm, 15-20 slm, 4-10 sccm and 300-600 sccm, respectively, into the reaction chamber 1 but the supply of hydrogen gas is still discontinued. The $In_xGa_{1-x}N$ (where 0<x<1) well layer 104 is typically deposited to a thickness of 5 nm or more and the thickness of the GaN barrier layer 103 is preferably defined according to the thickness of the $In_xGa_{1-x}N$ (where 0<x<1) well layer 104. For example, if the $In_xGa_{1-x}N$ (where 0<x<1) well layer 104 has a thickness of 9 nm, then the GaN barrier layer 103 preferably has a thickness of 15 to 30 nm.

In this manner, three or more pairs of GaN barrier layers 103 and $In_xGa_{1-x}N$ (where 0<x<1) well layers 104 are alternately stacked one upon the other by performing the same process step a number of times. As a result, a GaN/InGaN multi-quantum well light-emitting layer 105 to emit radiation is formed by stacking the GaN barrier layers 103 and the $In_xGa_{1-x}N$ (where 0<x<1) well layers 104 in three or more cycles. The number of cycles is defined to be at least three in this example because the greater the number of $In_xGa_{1-x}N$ (where 0<x<1) well layers 104 stacked, the larger the volume that can capture carriers contributing to radiative recombination and the higher the efficiency of the device as a final product will be.

According to a conventional (0001) c-plane crystal-growing process, to minimize the influence of the quantum confined Stark effect, the thickness of InGaN well layers that form the light-emitting portion should be reduced to a certain level (which is typically 5 nm or less). On the other hand, if the principal surface is a non-polar plane such as an m-plane, no quantum confined Stark effect will be produced at all. For that reason, in an m-plane crystal-growing process, the thickness of the InGaN well layers 104 does not have to be decreased but should rather be increased to expand the volume that can capture carriers contributing to the radiative recombination. That is why according to this preferred embodiment, it is preferred that the InGaN well layers 104 have a thickness of at least 5 nm each. However, each InGaN well layer 104 preferably has a thickness of at most 20 nm because an InGaN well layer 104 with a thickness of more than 20 nm would have a non-uniform In composition.

When every $In_xGa_{1-x}N$ (where 0<x<1) well layer 104 of the GaN/InGaN multi-quantum well light-emitting layer 105 is formed, the TMI gas stops being supplied and the hydrogen gas starts to be supplied again. Then, nitrogen and hydrogen gases are supplied as carrier gases into the reaction chamber 1 at flow rates of 3 to 8 slm and 4 to 10 slm, respectively. Furthermore, as shown in FIGS. 9 and 10, the growing process temperature is raised to 1,000° C. and TMG (or TEG) and ammonia gases are supplied as source gases and a $Cp_2Mg$ (bis-cyclopentadienyl magnesium) gas is supplied as a source gas of magnesium as a p-type dopant, thereby growing a p-GaN layer 106. In this process step, the rates of supplying the $Cp_2Mg$ and TMG (or TEG) gases and other process conditions are adjusted so that the concentration of magnesium in the p-GaN layer 106 will fall within the range of $4.0 \times 10^{18}$ $cm^{-3}$ to $1.8 \times 10^{19}$ $cm^{-3}$, more preferably within the range of $6.0 \times 10^{18}$ $cm^{-3}$ to $9.0 \times 10^{18}$ $cm^{-3}$. Those conditions may be adjusted by controlling the rate of supplying the $Cp_2Mg$ gas with the growing process temperature set to be around 1,000° C. and with the rate of supplying the TMG (or TEG) gas fixed, for example. Specifically, the TMG (or TEG), ammonia and $Cp_2Mg$ gases may be supplied at flow rates of 5-10 sccm, 4-10 slm and 10-100 sccm, respectively.

Optionally, the p-GaN layer 106 may be heavily doped with magnesium to a concentration exceeding $1.8 \times 10^{19}$ $cm^{-3}$ at a depth of approximately 20 nm under its surface (i.e., in the uppermost surface region with a thickness of approximately 20 nm). In that case, all of the p-GaN layer 106 but that uppermost surface region may have a magnesium concentration falling within the range of $4.0 \times 10^{18}$ $cm^{-3}$ to $1.8 \times 10^{19}$ $cm^{-3}$, more preferably within the range of $6.0 \times 10^{18}$ $cm^{-3}$ to $9.0 \times 10^{18}$ $cm^{-3}$. If the concentration of a p-type dopant is locally increased in such an uppermost surface region of the GaN layer that contacts with a p-electrode, then the contact resistance can be reduced most significantly. In addition, by introducing the dopant in this manner, the in-plane variation in current-voltage characteristic can also be reduced, and therefore, the variation in drive voltage from one chip to another can be reduced as well.

Next, in Step S14, the substrate is cooled. Specifically, after the p-GaN layer 106 has been formed, the gas supplier 5 shown in FIG. 8 is controlled so as to stop supplying the TMG (or TEG) and $Cp_2Mg$ gases as Ga and Mg source gases and the hydrogen gas as a carrier gas (see FIG. 10). At the same time, the exhauster 6 shown in FIG. 8 eliminates hydrogen from the atmosphere in the reaction chamber 1. After the hydrogen gas has been removed sufficiently, the substrate starts to be cooled. In this process step of cooling the substrate, in order to detach H atoms in the p-GaN layer 106 from magnesium as efficiently as possible, it is important to eliminate hydrogen from the atmosphere in the reaction chamber at least as much as possible and preferably almost completely.

As described above, the MOCVD system shown in FIG. 8 includes the carbon susceptor 4 as a heat source. In order to keep the temperature of the substrate (i.e., the temperature to be measured with the thermocouple) constant while the p-GaN layer 106 is being grown in Step S13, the substrate is heated. In Step S14, the timing to start cooling the substrate refers to either a point in time when the substrate stops being heated or a point in time when the temperature of the substrate is lowered by applying a smaller quantity of heat to the substrate than in Step S13.

In the reaction chamber 1 shown in FIG. 8, while the upstream gas supplier 5 is supplying the various gases, the downstream exhauster 6 always runs its rotary pump, thereby exhausting the reaction chamber 1. As a result, the pressure inside the reaction chamber 1 can be kept constant. Once the gas supplier 5 stops supplying the hydrogen gas to the reaction chamber 1, the hydrogen gas remaining in the reaction chamber 1 will be let out in a very short time. The substrate may start being cooled either when, or shortly after, the gas supplier 5 stops supplying the hydrogen gas into the reaction chamber 1. Alternatively, the hydrogen gas may also stop being supplied after the substrate has started to be cooled but has not had its temperature lowered to 850° C. yet. Even so, the concentration of hydrogen in the reaction chamber will still be lower than in the conventional process in that interval between the point in time when the hydrogen gas stopped being supplied and the point in time when the substrate temperature reaches 850° C., and therefore, the effect of the present invention can also be achieved. Nevertheless, once the supply of the hydrogen gas is "cut off", even a very small amount of hydrogen should not enter the reaction chamber 1 but it is preferred that the reaction chamber 1 is completely free from hydrogen.

As shown in FIG. 10, the only gases supplied into the reaction chamber 1 in the cooling process step S14 are nitrogen and ammonia gases. It is preferred that the nitrogen gas be supplied instead of the hydrogen gas shut off until the temperature of the substrate is lowered to less than 900° C., to say the least. Once the supply of the hydrogen gas has been cut off, the rate of supplying the nitrogen gas needs to be increased by the rate at which the hydrogen gas was supplied before its supply is cut off. For instance, if the hydrogen gas was supplied at a rate of 5 slm in Step S13, the flow rate of the nitrogen gas needs to be increased by 5 slm in Step S14 when the hydrogen gas is shut off. By supplying the nitrogen gas at such an increased rate in this manner, the substrate can be cooled more quickly and the cooling process time can be shortened as well. The present inventors discovered and confirmed via experiments that if a gallium nitride-based compound semiconductor layer, of which the principal surface is an m-plane, was exposed to an elevated temperature of 950° C. or more for a long time, the surface would be etched so much as to produce significant surface roughening. That is why the substrate is preferably cooled as quickly as possible in the temperature range of 900° C. to 1,000° C. at which the p-GaN layer 106 grows. The time it would take to lower the temperature of the substrate from approximately 1,000° C. to lower than 900° C. is typically less than two minutes.

On the other hand, the ammonia gas is preferably supplied continuously until the temperature of the substrate being lowered reaches approximately 400° C., when the decomposition rate of ammonia becomes approximately equal to zero. That is why by continuously supplying the ammonia gas until the substrate temperature being lowered reaches approximately 400° C., it is possible to prevent nitrogen from detaching itself from the p-GaN layer 106. According to this preferred embodiment, until the substrate temperature reaches about 400° C., the nitrogen gas is also supplied continuously into the reaction chamber 1. After that, when sufficiently cooled, the substrate will be unloaded from the reaction chamber (in Step S15 shown in FIG. 6). It should be noted that the temperature at which the supply of the ammonia gas is cut off does not have to be 400° C. but may also be any other temperature as long as it is possible to prevent nitrogen from detaching itself from the p-GaN layer 106. For example, the supply of the ammonia gas could also be cut off at a temperature falling within the range of 600° C. to 800° C.

According to a typical conventional procedure, the annealing process step S16 shown in FIG. 6 needs to be performed to activate the p-type dopant in the p-GaN layer 106. On the other hand, according to this preferred embodiment, by cooling the substrate in Step S14 with the supply of the hydrogen gas to the reaction chamber 1 cut off, the concentration of hydrogen in the reaction chamber during the cooling process step can be much lower than in the conventional process. As a result, the hydrogen atoms that bonded to magnesium atoms when the p-GaN layer 106 was formed can easily detach themselves from the magnesium atoms in the cooling process step. Consequently, those magnesium atoms are activated and the p-GaN layer 106 comes to have lower resistivity. That is why the annealing process step that would have to be performed in the conventional process to activate the magnesium atoms can be omitted according to the present invention. It should be noted that hydrogen atoms would also behave similarly even if Ga in the p-GaN layer 106 was partially replaced with Al or In.

The substrate that has been unloaded from the reaction chamber is subjected to the electrode forming process step S17 shown in FIG. 6. Specifically, only particular portions of the p-GaN layer 106 and GaN/InGaN multi-quantum well light-emitting layer 105 are removed by photolithography and etching techniques, thereby partially exposing the n-GaN layer 102. And an n-electrode 107 consisting of Ti and Al layers is formed on the exposed region of the p-GaN layer 102. On the other hand, a p-electrode 108 is formed on a predetermined region of the p-GaN layer 106. The p-electrode 108 may consist of Mg and Pt layers, Zn and Pt layers, Mg and Ag layers, Zn and Ag layers, or Ni and Au layers, for example. By performing these process steps, a light-emitting device 100 that produces emission at any desired wavelength is completed.

Figure 11:
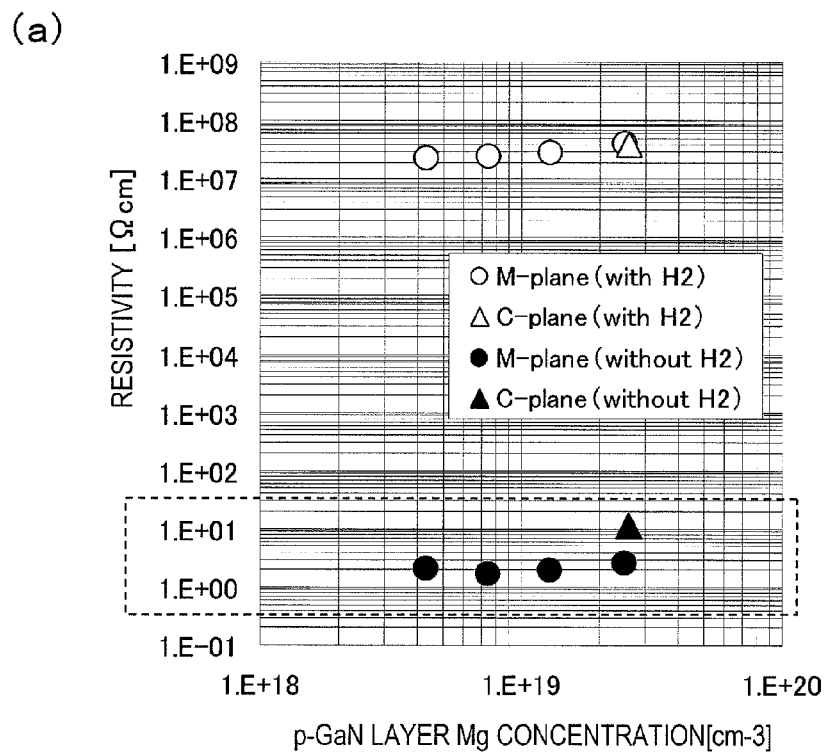
FIG. 11(a) is a graph showing how the resistivity of a p-GaN layer varied according to its magnesium concentration and FIG. 11(b) is a graph showing, on a larger scale, the range surrounded with the dotted rectangle in FIG. 11(a).
Figure 11:
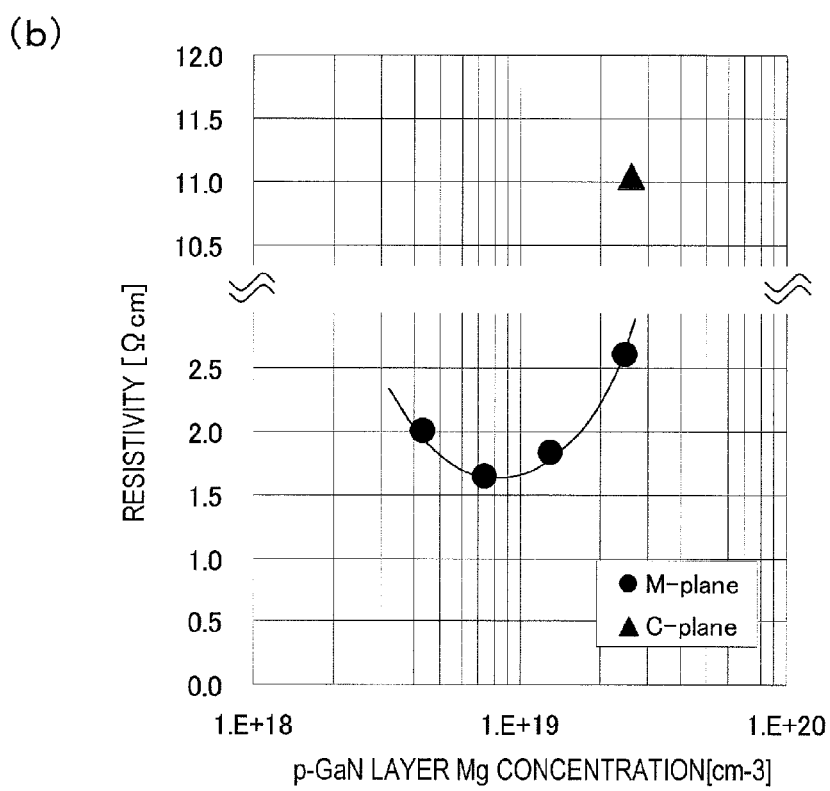

FIG. 11($a$) is a graph showing how the resistivity of a p-GaN layer varied according to its magnesium concentration. In FIG. 11($a$), the resistivities of m-plane-growing p-GaN layers that were formed by the method of this preferred embodiment are indicated by the solid circles (●). As the m-plane-growing semiconductor layers, samples with Mg concentrations of $4.3 \times 10^{18}$ cm$^{-3}$, $7.4 \times 10^{18}$ cm$^{-3}$, $1.3 \times 10^{19}$ cm$^{-3}$ and $2.5 \times 10^{19}$ cm$^{-3}$, respectively, were used. Each of these m-plane-growing p-GaN layers of this preferred embodiment was formed by completely eliminating hydrogen from inside the reaction chamber after its crystals had grown at 1,000° C. and then cooling the substrate to a temperature of 850° C. with additional nitrogen gas supplied into the reaction chamber instead of the hydrogen gas shut off. The cooling process time that was taken to cool the substrate from the crystal-growing temperature of the m-plane-growing p-GaN layer down to 850° C. was approximately 90 seconds. Once the temperature being lowered reached 850° C., the excessive nitrogen gas that had been supplied instead of the hydrogen gas shut off was also cut off but the cooling process was carried out even after that. Ammonia gas continued to be supplied until the temperature was decreased to less than approximately 400° C. The substrate that was unloaded from the reaction chamber was subjected to no additional annealing process at all.

For the purpose of comparison, in FIG. 11($a$), the resistivities of c-plane-growing p-GaN layers, which were also formed by cooling the substrate with hydrogen completely eliminated from the reaction chamber as in this preferred embodiment, are indicated by the solid triangles (▲). Each of those c-plane-growing p-GaN layers was formed by quite the same process as the m-plane-growing p-GaN layer of this preferred embodiment except that the c-plane-growing p-GaN layer had an Mg concentration of $2.6 \times 10^{19}$ cm$^{-3}$ and that its crystal-growing plane was a c-plane. Furthermore, in FIG. 11(a), the resistivities of m-plane- and c-plane-growing p-GaN layers that were formed with hydrogen gas continuously supplied as in the conventional process even after their crystals had grown are indicated by the open circles (○) and the open triangles (△), respectively. Each of those m-plane-growing p-GaN layers was formed in quite the same way as the m-plane-growing p-GaN layer of this preferred embodiment except that hydrogen was supplied in the cooling process step. On the other hand, each of those c-plane-growing p-GaN layers was formed in quite the same way as the m-plane-growing p-GaN layer of this preferred embodiment except that its crystal-growing plane was a c-plane and that hydrogen was supplied in the cooling process step. In any case, when hydrogen was supplied, the resistivities of the m-plane- and c-plane-growing p-GaN layers as indicated by the open circles (○) and the open triangles (△) were both more than $1 \times 10^7$ Ωcm, which is almost as high resistivity as an insulator's. Meanwhile, it can also be seen that the m-plane- and c-plane-growing p-GaN layers, which were formed with hydrogen completely eliminated during the cooling process, had significantly lower resistivities than the conventional ones.

The range surrounded with the dotted rectangle in FIG. 11(a) is shown on a larger scale in FIG. 11(b). As can be seen from FIG. 11(b), the c-plane-growing p-GaN layer, which was formed with hydrogen totally eliminated in the cooling process, had a resistivity of approximately 11 Ωcm as indicated by the solid triangle ▲. However, the present inventors discovered and confirmed via experiments that irrespective of its magnesium concentration, the c-plane-growing p-GaN layer always achieved a resistivity of 2.0 Ωcm or less even without being subjected to any annealing process. On the other hand, the m-plane-growing p-GaN layer that was formed with hydrogen totally eliminated in the cooling process achieved an even lower resistivity as indicated by the solid circles ● than the c-plane-growing p-GaN layers. As for a light-emitting device, it is preferred that its p-GaN layer have a resistivity of 2.0 Ωcm or less. When measurements were done on the m-plane-growing p-GaN layer, the resistivity was 2.0 Ωcm or less at a dopant concentration of $4.0 \times 10^{18}$ cm$^{-3}$ to $1.8 \times 10^{19}$ cm$^{-3}$. Also, if the dopant concentration fell within the range of $6.0 \times 10^{18}$ cm$^{-3}$ to $9.0 \times 10^{18}$ cm$^{-3}$, the resistivity could be as low as about 1.5 Ωcm. Thus, according to this preferred embodiment, resistivity that is low enough for a light-emitting device can be achieved even without performing any additional annealing process.

Also, in the m-plane-growing p-GaN layer, from which the results shown in FIG. 11(b) were obtained, no fine surface roughening as in the photographs shown in FIGS. 5(a) to 5(c) was observed at all. As described above, since the annealing process can be omitted according to this preferred embodiment, the surface roughening never arises on the m-plane-growing p-GaN layer.

Figure 12:
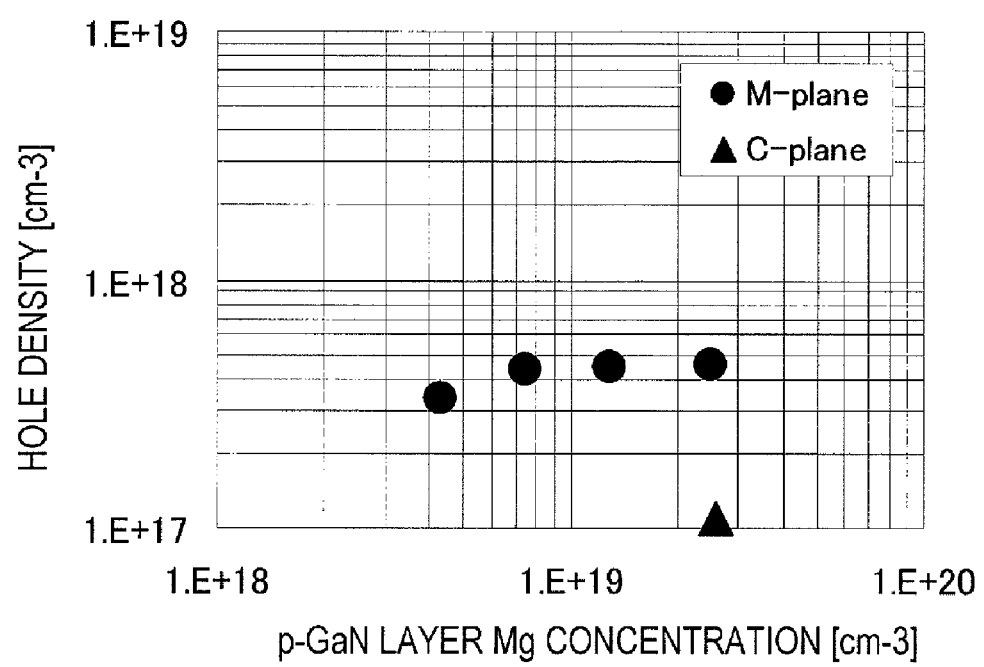
FIG. 12 is a graph showing how the hole density varied with the magnesium concentration in the m-plane- and c-plane-growing p-GaN layers that were formed with hydrogen totally eliminated in the cooling process.

FIG. 12 is a graph showing how the hole density varied with the magnesium concentration in the m-plane- and c-plane-growing p-GaN layers that were formed with hydrogen totally eliminated in the cooling process. The respective samples with the m-plane-growing p-GaN layer had Mg concentration of $4.3 \times 10^{18}$ cm$^{-3}$, $7.4 \times 10^{18}$ cm$^{-3}$, $1.3 \times 10^{19}$ cm$^{-3}$, and $2.5 \times 10^{19}$ cm$^{-3}$, respectively. And the sample with the c-plane-growing p-GaN layer had an Mg concentration of $2.6 \times 10^{19}$ cm$^{-3}$. These densities and concentrations were measured on samples, each including a substrate, a non-doped GaN layer that had been deposited to a thickness of 1 μm on the substrate, and a (m-plane-growing or c-plane-growing) p-GaN layer that had been deposited on the non-doped GaN layer to a thickness of 0.7 to 1 μm. In this case, the m-plane-growing and c-plane-growing p-GaN layers were formed on the same conditions as those samples shown in FIGS. 11(a) and 11(b), which were formed with hydrogen eliminated. As shown in FIG. 12, the c-plane-growing p-GaN layer had as low a hole density as $1 \times 10^{17}$ cm$^{-3}$, but the m-plane-growing p-GaN layer having the same magnesium concentration had a hole density of $3 \times 10^{17}$ cm$^{-3}$ to $5 \times 10^{17}$ cm$^{-3}$. These results reveal that the m-plane-growing p-GaN layer had a higher hole density and had had activated magnesium to a higher degree than the c-plane-growing p-GaN layer. Consequently, the m-plane-growing p-GaN layer would have had lower in-plane resistivity than the c-plane-growing p-GaN layer, and the results shown in FIGS. 11(a) and 11(b) were obtained.

Figure 13:
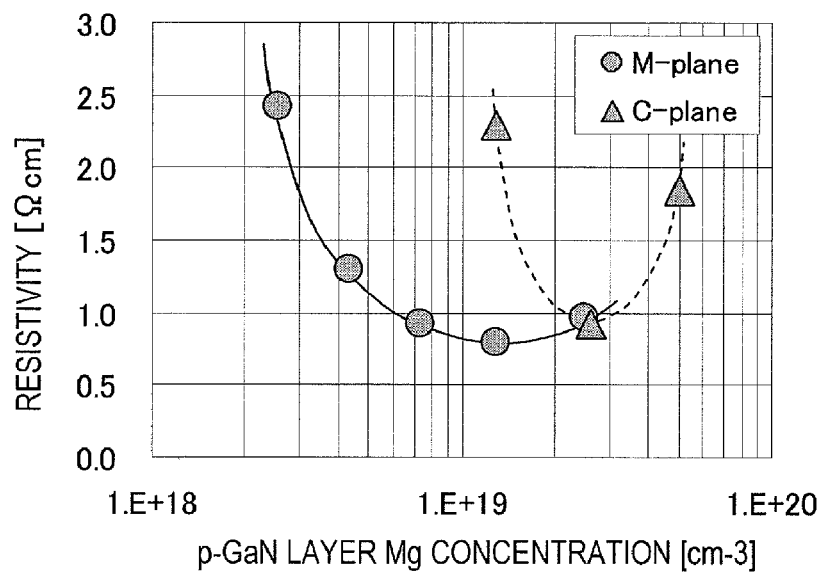
FIG. 13(a) is a graph showing the resistivities that were obtained in a situation where m-plane growing and c-plane-growing p-GaN layers, which had been formed with hydrogen supplied continuously in the cooling process after their crystals had grown, were subjected to annealing as in the conventional process.
FIG. 13(b) is a graph showing how in the samples subjected to the measurement shown in FIG. 13(a), their hole density that was measured after they had been annealed varied with their magnesium concentration.
Figure 13:
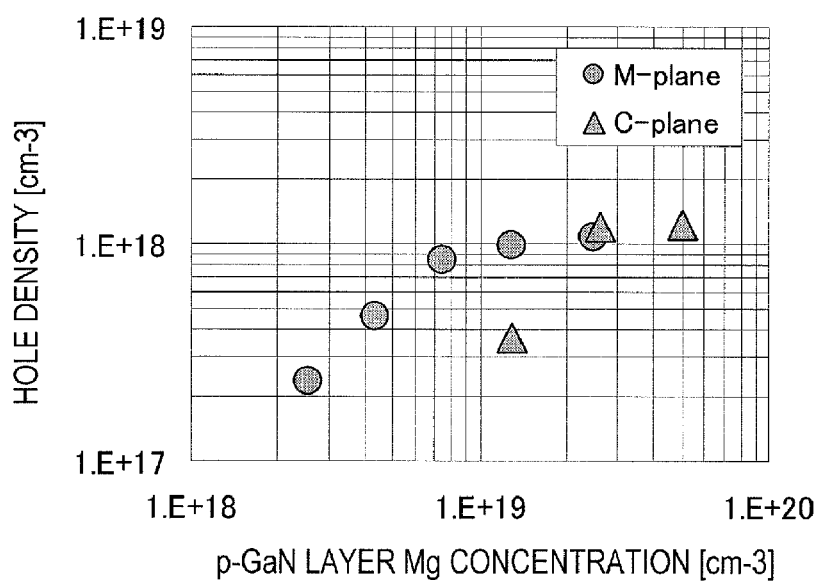

FIG. 13(a) shows the electrical characteristics that were obtained in a situation where a p-GaN layer, which had been formed with hydrogen supplied continuously in the cooling process after its crystals had grown, was subjected to annealing as in the conventional process. Specifically, the resistivities of m-plane-growing and c-plane-growing p-GaN layers are shown in FIG. 13(a). The samples with the m-plane-growing semiconductor layer had Mg concentrations of $4.3 \times 10^{18}$ cm$^{-3}$, $7.4 \times 10^{18}$ cm$^{-3}$, $1.3 \times 10^{19}$ cm$^{-3}$, and $2.5 \times 10^{19}$ cm$^{-3}$, respectively. And the samples with the c-plane-growing semiconductor layer had Mg concentrations of $1.3 \times 10^{19}$ cm$^{-3}$, $2.6 \times 10^{19}$ cm$^{-3}$ and $5.0 \times 10^{19}$ cm$^{-3}$, respectively. The annealing process was performed on the substrate that had been unloaded from the reaction chamber using an annealing processing system provided separately from the crystal grower so that the p-GaN layer was heated at 830° C. for 20 minutes within a nitrogen gas ambient.

As shown in FIG. 13(a), even when subjected to the annealing process, the m-plane-growing p-GaN layer still had lower resistivity than the c-plane-growing p-GaN layer. However, it was confirmed that fine surface roughening as shown in FIGS. 5(a) to 5(c) had been produced locally on the surface of the m-plane-growing p-GaN layer that was subjected to the measurement as shown in FIG. 13(a). It can be seen that since no such fine surface roughening was observed on the m-plane-growing p-GaN layer that had not been subjected to the annealing process yet, that surface roughening was produced by nothing but the annealing process itself. On the other hand, no surface roughening was observed on the c-plane-growing p-GaN layer that had been subjected to the annealing process.

FIG. 13(b) shows how in the samples subjected to the measurement shown in FIG. 13(a), their hole density that was measured after they had been annealed varied with their magnesium concentration. As shown in FIG. 13(b), in both of the c-plane-growing p-GaN layer and the m-plane-growing p-GaN layer, once the magnesium concentration reached a particular value of around $2 \times 10^{19}$ cm$^{-3}$, the hole density approached a certain value of $1 \times 10^{18}$ cm$^{-3}$ and got to a saturation point. On the other hand, in a situation where the magnesium concentration was lower than $2 \times 10^{19}$ cm$^{-3}$ (i.e., before the hole density got saturated), when comparing at the same magnesium concentration, the hole density of the m-plane-growing p-GaN layer was higher than that of the c-plane-growing p-GaN layer. These results reveal that the m-plane-growing p-GaN layer had been activated more efficiently than the c-plane-growing p-GaN layer. For example, when the magnesium concentration was $1.5 \times 10^{19}$ cm$^{-3}$, the c-plane-growing p-GaN layer had a hole density of approximately $3.5 \times 10^{17}$ cm$^{-3}$ but the m-plane-growing p-GaN layer had a hole density of approximately $1.0 \times 10^{18}$ cm$^{-3}$. Thus, it can be seen that H atoms can be detached from the m-plane-growing p-GaN layer almost three times as efficiently as from the c-plane-growing p-GaN layer.

Also, as shown in FIG. 13(a), when its magnesium concentration was approximately $1.5 \times 10^{19}$ cm$^{-3}$, the m-plane-growing p-GaN layer had the lowest resistivity. On the other hand, when its magnesium concentration was approximately $2.5 \times 10^{19}$ cm$^3$, the c-plane-growing p-GaN layer had the lowest resistivity. Thus, the magnesium concentration at which the m-plane-growing p-GaN layer had the lowest resistivity was almost a half as high as the one at which the c-plane-growing p-GaN layer had the lowest resistivity. In addition, although the c-plane-growing p-GaN layer had a relatively narrow magnesium concentration range in which the resistivity was equal to or lower than a desired value of 2.0 Ωcm or less, the m-plane-growing p-GaN layer had a relatively broad magnesium concentration range in which the desired resistivity of 2.0 Ωcm or less was achieved. Furthermore, when its magnesium concentration was approximately $4.0 \times 10^{18}$ cm$^{-3}$, the resistivity of the m-plane-growing p-GaN layer was also less than 1.5 Ωcm. In the c-plane-growing p-GaN layer, on the other hand, when its magnesium concentration was approximately $2.5 \times 10^{19}$ cm$^{-3}$, its resistivity was also less than 1.5 Ωcm. However, when its magnesium concentration was approximately $1.5 \times 10^{19}$ cm$^{-3}$, its resistivity was already higher than 2.0 Ωcm. And the lower the magnesium concentration, the higher its resistivity got. Thus, it can be seen that the magnesium concentration at which the m-plane-growing p-GaN layer achieved the desired resistivity was much lower than the one at which the c-plane-growing p-GaN layer achieved the same resistivity.

Now, let us compare the resistivity in a situation where magnesium was activated by the annealing process as shown in FIG. 13(a) to the resistivity in a situation where magnesium was activated by the method of this preferred embodiment as shown in FIG. 11(b). Specifically, the magnesium concentration at which the lowest resistivity was achieved was approximately $1.5 \times 10^{19}$ cm$^{-3}$ in FIG. 13(a) but approximately $7.0 \times 10^{18}$ cm$^{-3}$ in FIG. 11(b). Thus, it can be said that if magnesium was activated by the method of this preferred embodiment, that low resistivity was achieved in a lower magnesium concentration range compared to a situation where magnesium was activated by annealing process. This result was obtained probably because according to the method of this preferred embodiment, as the magnesium concentration decreased, the hole density also decreased but such a low hole density was compensated for by a high hole mobility. In fact, when the magnesium concentration exceeded $1.8 \times 10^{19}$ cm$^{-3}$, the hole mobility decreased so significantly that the resistivity was higher than 2.0 Ωcm as shown in FIG. 11(b). If the magnesium concentration in a p-GaN layer decreases, the light emitted from the light-emitting layer will not be easily absorbed again and magnesium will not diffuse so easily from the p-GaN layer into the active layer, both of which are beneficial.

Comparing FIG. 11(b) to FIG. 13(a), it can be seen that the electrical characteristic (i.e., the resistivity in this case) of the m-plane-growing p-GaN layer formed by the method of this preferred embodiment was slightly inferior to that of the c-plane-growing p-GaN layer that had been subjected to the conventional annealing process. However, the m-plane-growing p-GaN layer will achieve several times as high activation efficiency as, and has a broader magnesium concentration range in which the low resistivity is achieved than, the c-plane-growing p-GaN layer. By taking advantage of these two features, the m-plane-growing p-GaN layer can have resistivity that is low enough to make a light-emitting device.

Patent Document No. 2 (Japanese Patent Publication No. 4103309) discloses a technique for activating a p-type gallium nitride-based compound semiconductor layer by controlling the concentration of hydrogen in a reaction chamber while its substrate is being cooled. According to the technique disclosed in Patent Document No. 2, however, the crystal-growing plane of the p-GaN layer is supposed to be a c-plane, and therefore, it is more difficult to increase the density of holes (which are positive carriers) sufficiently than in an m-plane-growing p-GaN layer.

The present inventors discovered as a result of extensive researches that by stopping the supply of hydrogen gas in the process step of cooling an m-plane-growing p-type gallium nitride-based compound semiconductor layer, the resultant resistivity was almost comparable to the one achieved by the conventional annealing process. That resistivity can be particularly low if the concentration of magnesium in the crystals is adjusted to fall within the range of $4.0 \times 10^{18}$ cm$^{-3}$ to $1.8 \times 10^{19}$ cm$^{-3}$, more preferably within the range of $6.0 \times 10^{18}$ cm$^{-3}$ to $9.0 \times 10^{18}$ cm$^{-3}$. In this manner, the annealing process can be omitted, and therefore, surface roughening will never arise on the m-plane-growing p-type gallium nitride-based compound semiconductor layer.

In the foregoing description, preferred embodiments of the present invention have been described while referring to specific process conditions including the flow rates of gases to be supplied and the temperatures at which gallium nitride-based compound semiconductor layers are supposed to be grown. However, those values are only an example and the present invention is in no way limited to those specific preferred embodiments.

Also, according to the present invention, the p-type gallium nitride-based compound semiconductor layer does not have to be a p-GaN layer but may also be made of any other p-type $Al_xIn_yGa_zN$ (where $x+y+z=1$, $x \geq 0$, $y \geq 0$ and $z \geq 0$) compound semiconductor. Furthermore, according to the present invention, the p-type dopant does not have to be Mg but may also be Zn or Be, for example.

The effect of the present invention will also be achieved even when a non-LED light-emitting device with a p-type gallium nitride-based compound semiconductor layer (i.e., a semiconductor laser diode) or a non-light-emitting device (such as a transistor or a photodetector) is fabricated.

Industrial Applicability

According to the present invention, an m-plane-growing p-type gallium nitride-based compound semiconductor layer, in which no quantum confined Stark effect is produced, can achieve low resistivity without producing any surface roughening. Thus, the present invention is applicable effectively to making a light-emitting device.

REFERENCE SIGNS LIST 1 reaction chamber
2 crystal-growing substrate
3 quartz tray
4 carbon susceptor
5 gas supplier
6 exhauster
100 semiconductor device
101 substrate
102 n-GaN layer
103 GaN barrier layer
104 $In_xGa_{1-x}N$ (where 0<x<1) well layer
105 GaN/InGaN multi-quantum well light-emitting layer
106 p-GaN layer
107 n-electrode
108 p-electrode
200 recess or projection

The invention claimed is:

1. A method for fabricating a semiconductor device, the method comprising the steps of:
   (a) growing a p-type gallium nitride-based compound semiconductor layer by performing a metal organic chemical vapor deposition process in a heated atmosphere so that the crystal-growing plane of the semiconductor layer is an m plane;
   (b) cooling the p-type gallium nitride-based compound semiconductor layer after the step (a) has been carried out;
   (c) growing three or more well layers before the step (a); and
   (d) growing n-type semiconductor layer on a substrate before the step (c),
   wherein the step (d) includes heating the substrate with source, n-type dopant and carrier gases supplied into a reaction chamber, the carrier gas including hydrogen,
   the step (c) includes growing the well layers with the supply of the hydrogen gas to the reaction chamber cut off, each well layer having a thickness of 5 nm or more,
   the step (a) includes supplying hydrogen gas to the reaction chamber in which the p-type gallium nitride-based compound semiconductor layer is grown, and
   the step (b) includes cooling the p-type gallium nitride-based compound semiconductor layer with the supply of the hydrogen gas to the reaction chamber cut off.

2. The method of claim 1, wherein the step (b) includes starting to cool the p-type gallium nitride-based compound semiconductor layer as soon as or after the supply of the hydrogen gas is cut off.

3. The method of claim 1, wherein the step (b) includes starting to cool the p-type gallium nitride-based compound semiconductor layer before the supply of the hydrogen gas is cut off.

4. The method of claim 3, wherein the step (a) includes heating the p-type gallium nitride-based compound semiconductor layer to a temperature that is higher than 850° C., and
   wherein the step (b) includes stopping supplying the hydrogen gas after the p-type gallium nitride-based compound semiconductor layer has started to be cooled and before the temperature of the p-type gallium nitride-based compound semiconductor layer reaches 850° C.

5. The method of claim 1, wherein the step (a) includes supplying source gases including ammonia gas to the reaction chamber, and
   wherein the step (b) includes continuously supplying the ammonia gas to the reaction chamber even after the supply of the hydrogen gas has been cut off.

6. The method of claim 5, wherein the step (a) includes supplying not only the source gases but also nitrogen gas to the reaction chamber, and
   wherein the step (b) includes increasing, after the supply of the hydrogen gas has been cut off, the rate of supplying the nitrogen gas by the rate at which the hydrogen gas has been supplied before being shut off.

7. The method of claim 1, wherein, at the step (b), an amount of time the temperature of the p-type gallium nitride-based compound semiconductor layer is lowered from 1,000° C. to 900° C. in less than two minutes.

8. The method of claim 1, wherein the step (a) includes growing the p-type gallium nitride-based compound semiconductor layer so that the concentration of magnesium in the p-type gallium nitride-based compound semiconductor layer falls within the range of $7.4 \times 10^{18}$ cm$^{-3}$ to $9.0 \times 10^{18}$ cm$^{-3}$.

9. The method of claim 1, wherein magnesium is added as a p-type dopant to the p-type gallium nitride-based compound semiconductor layer, and
   wherein the step (a) includes growing the p-type gallium nitride-based compound semiconductor layer so that the concentration of magnesium in the p-type gallium nitride-based compound semiconductor layer falls within the range of $4.0 \times 10^{18}$ cm$^{-3}$ to $1.8 \times 10^{19}$ cm$^{-3}$.

10. The method of claim 9, wherein the step (a) includes growing the p-type gallium nitride-based compound semiconductor layer so that the concentration of magnesium in the p-type gallium nitride-based compound semiconductor layer falls within the range of $6.0 \times 10^{18}$ cm$^{-3}$ to $9.0 \times 10^{18}$ cm$^{-3}$.

11. The method of claim 1, wherein each well layer has a thickness of 20 nm or less.

* * * * *